United States Patent [19]

Elder et al.

[11] 4,020,421
[45] Apr. 26, 1977

[54] MUTING CIRCUIT

[75] Inventors: James H. Elder, Brookneal; Hubert A. Patterson, Lynchburg, both of Va.

[73] Assignee: General Electric Company, Lynchburg, Va.

[22] Filed: Mar. 23, 1976

[21] Appl. No.: 669,634

[52] U.S. Cl. ............................... 325/478; 325/348; 325/466

[51] Int. Cl.² .......................................... H04B 1/10

[58] Field of Search .......... 325/478, 348, 466, 474, 325/402, 403, 322–324, 55

[56] References Cited

UNITED STATES PATENTS

| | | | |
|---|---|---|---|
| 3,486,119 | 12/1969 | Shimada | 325/466 |
| 3,496,467 | 2/1970 | Lundgren | 325/466 |
| 3,584,304 | 6/1971 | Casterline et al. | 325/478 |
| 3,654,555 | 4/1972 | Ryan et al. | 325/478 |
| 3,902,122 | 8/1975 | Sisson et al. | 325/466 |
| 3,927,376 | 12/1975 | Ferrie | 325/478 |

*Primary Examiner*—Robert L. Griffin
*Assistant Examiner*—Marc E. Bookbinder
*Attorney, Agent, or Firm*—James J. Williams

[57] ABSTRACT

In radio communication systems transmitting voice and data, data is frequently transmitted at the beginning of the transmission, and this may then be followed by voice. The sound of the data in the receiver loudspeaker is unnecessary and often annoying. This sound is eliminated by a muting circuit which initially mutes the receiver for a predetermined time following receipt of a carrier signal, and then mutes the receiver when data is detected. After the data ends, the receiver is unmuted if a carrier is still present.

6 Claims, 3 Drawing Figures

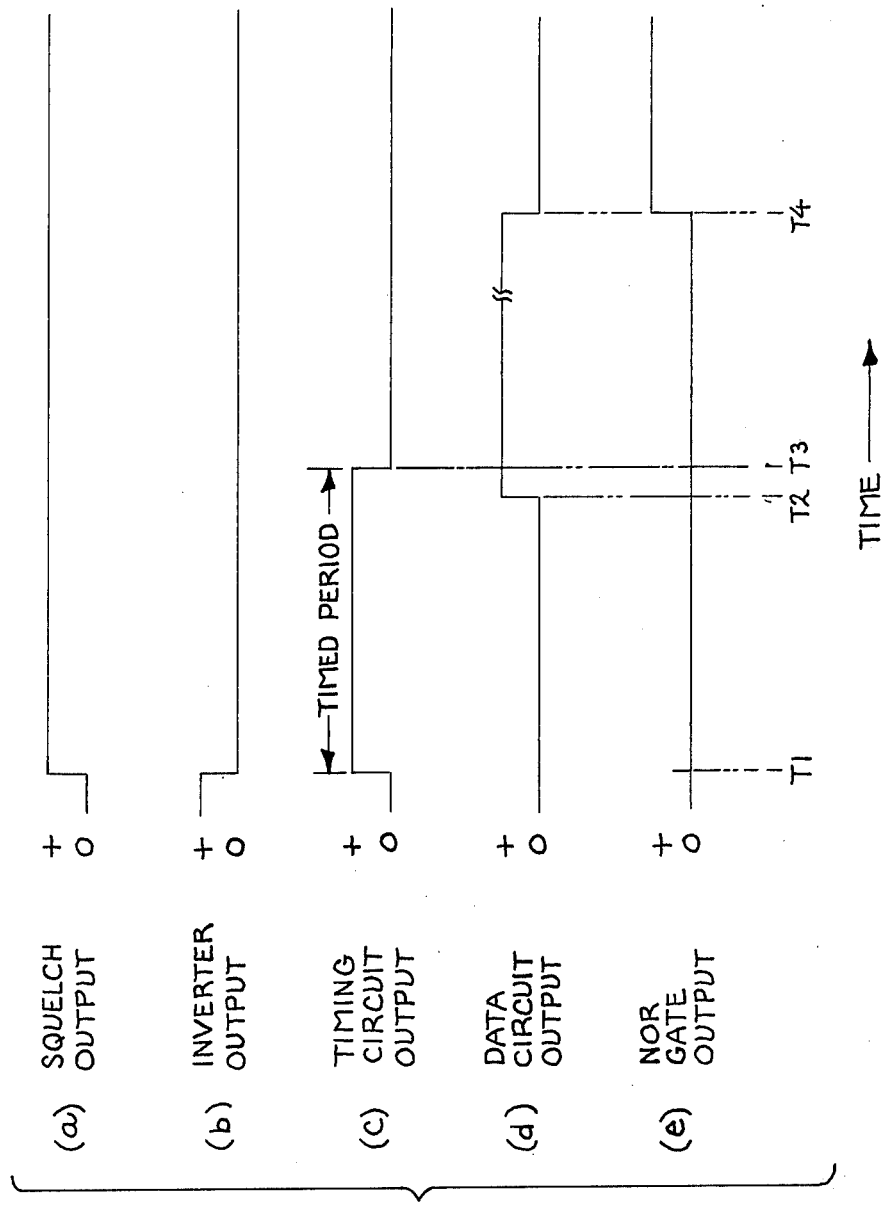

MUTING CIRCUIT

BACKGROUND OF THE INVENTION

Our invention relates to a muting circuit, and particularly to a muting circuit for muting a radio receiver loudspeaker during transmission of data signals.

Many communication systems use data to indicate conditions or functions. For example, in a radio communication system having a fixed base station and one or more mobile stations, the base station may wish to make a transmission directly to only one mobile station. This can be achieved by transmitting a data signal identifying the one mobile station at the beginning of the transmission, and by then sending a voice message. Or only a data signal identifying a station and providing a function or making an inquiry may be transmitted. In any case, it is desirable that the identified mobile station, as well as others, not reproduce the data sounds in the receiver loudspeaker, as such sounds are unnecessary and may be annoying.

Accordingly, a general object of our invention is to provide a new and improved muting circuit for radio receivers.

Another object of our invention is to provide a new and improved muting circuit for radio receivers which are used in a system where data may be or is transmitted.

In a radio system such as described above, transmissions may also be made without data, in which case an operator will begin to speak almost as soon as the transmission begins. In such cases, the receiver should be unmuted very quickly so as to reproduce the voice transmissions.

Accordingly, another object of our invention is to provide a new and improved radio receiver muting circuit that provides a fixed muting time at the beginning of a received transmission, and that continues to mute the receiver if data is received, or that unmutes the receiver if no data is received but the transmission is continued.

SUMMARY OF THE INVENTION

Briefly, these and other objects are achieved in accordance with our invention by a muting circuit that includes timing means for producing a predetermined timing signal in response to an unsquelch signal from a radio receiver. Circuit means are connected to the timing means, to the receiver squelch circuit, and to the receiver data circuit. These circuit means mute the receiver if the squelch circuit produces a squelch signal, or if the predetermined timing signal is present, or if a data signal is present. The circuit means unmute the receiver if the squelch circuit produces an unsquelch signal, and if the timing signal and the data signal are both absent. Thus, data will not be heard by a listener, but voice signals will be heard.

BRIEF DESCRIPTION OF THE DRAWING

The subject matter which we regard as our invention is particularly pointed out and distinctly claimed in the claims. The structure and operation of our invention, together with further objects and advantages, may be better understood from the following description given in connection with the accompanying drawing, in which:

FIG. 3 shows wave forms for explaining the operation of our muting circuit.

DESCRIPTION OF A PREFERRED EMBODIMENT

Figure 1:
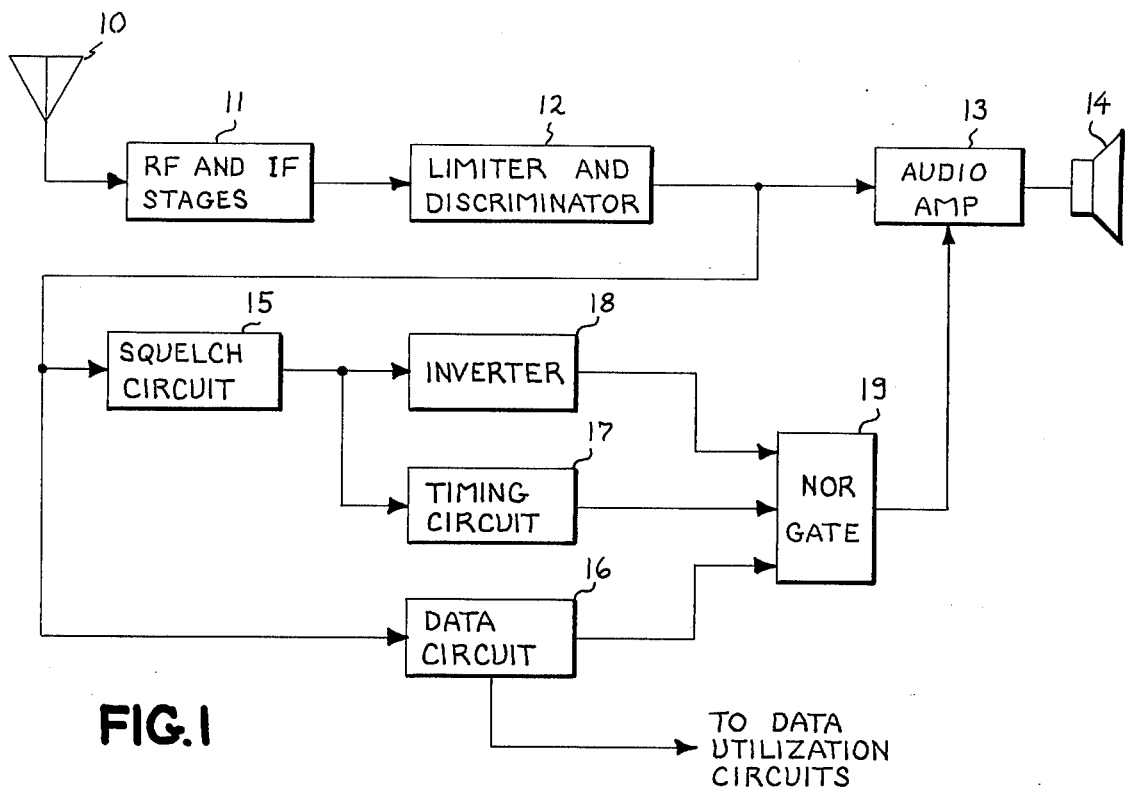
FIG. 1 shows a block diagram of a radio receiver provided with a muting circuit in accordance with our invention.

In FIG. 1 we have shown a typical application for our muting circuit, namely a frequency modulation radio receiver. Such a receiver is connected to an antenna 10 which supplies signals to radio frequency (RF), and intermediate frequency (IF) stages 11. These stages 11 provide selectivity and amplification at the received radio frequencies, heterodyne these frequencies, and provide further amplification at the intermediate frequencies. After this selection and amplification, the signals are applied to an amplitude limiter and discriminator 12 which limits their amplitude and then demodulates them to audio signals. These audio signals are applied to an audio amplifier 13 which includes a circuit or switch controlled by squelch and unsquelch signals. If a squelch signal is present, signals applied to the amplifier 13 are blocked so that the receiver is muted. If an unsquelch signal is present, the signals applied to the amplifier 13 are connected to a utilization device, such as a loudspeaker 14, so that the receiver is unmuted. The audio signals produced by the limiter and discriminator 2 are also applied to a squelch circuit 15. A typical noise squelch circuit, such as the circuit 15, detects noise frequencies above the normal voice frequencies of 3 KHz. If these noise frequencies exceed a selected amplitude, the squelch circuit 15 produces a squelch signal which is, in a prior art receiver, applied to the audio amplifier 13 to block or mute the audio signals. However if these noise frequencies fall below the selected amplitude, thus indicating the presence of a carrier, then the squelch circuit 15 produces an unsquelch signal which permits the amplifier 13 to pass or unmute audio signals. Signals from the limiter and discriminator 12 are also applied to a data circuit 16. The data circuit 16 is intended to detect pulses of tone, for example at a frequency of about 1110 Hz, and produce some indication of the combination of tone pulses. The combination of pulses may be utilized in any type of data utilization circuit, such as one that responds to a combination that indicates that a particular receiver is being called, or that makes an inquiry, or that makes a response.

The radio receiver described thus far is known in the art. If the receiver receives data pulses, such as indicated by intermittent bursts of tone, such bursts are normally applied to the audio amplifier 13 and reproduced by the loudspeaker 14. This can be annoying, as the bursts sound like noise. Thus, it is desirable that the audio amplifier 13 be blocked in some way so that the sounds caused by the bursts are not heard. The muting circuit in accordance with our invention provides such a blocking arrangement. Our muting circuit uses the data circuit 16. Our muting circuit comprises a timing circuit 17 which responds to an unsquelch signal from the squelch circuit 15 to start a predetermined timed period. Our muting circuit further comprises an inverter 18 which may be necessary if the unsquelch and squelch signals are not of the desired polarity. And last, our muting circuit comprises a three input logic or NOR gate 19. The three inputs of the NOR gate 19 are respectively connected to the data circuit 16, the timing circuit 17, and the inverter 18. The output from the NOR gate 19 is applied to the audio amplifier 13 and supplies a blocking signal (that is one which prevents the amplifier 13 from passing signals) if the unsquelch signal is absent, or if the timing signal is present, or if the data signal is present. The NOR gate 19 produces a passing signal (that is one which permits the amplifier 13 to pass signals) if the unsquelch signal is present, and if the timing signal is absent, and if the data signal is absent.

Figure 2:
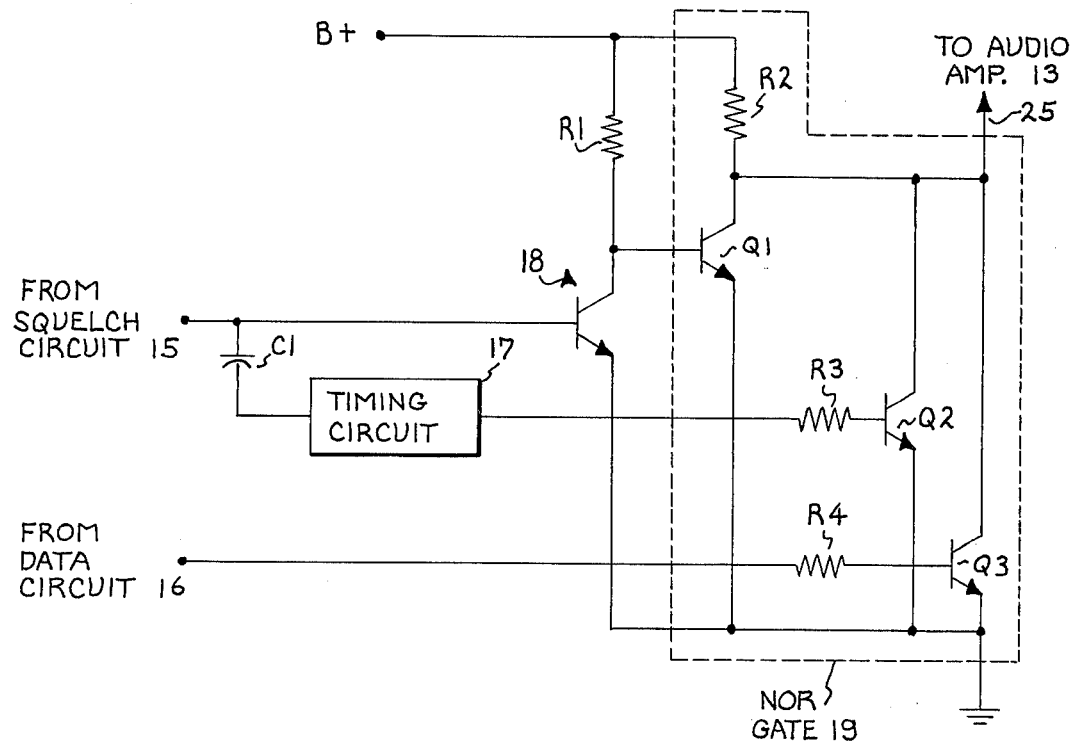
FIG. 2 shows a more detailed circuit diagram of our muting circuit of FIG. 1.

A more detailed diagram of our muting circuit is shown in FIG. 2. In FIG. 2, parts corresponding to FIG. 1 have been given the same reference numerals. Signals from the squelch circuit 15 are applied to an inverter transistor 18. The transistor 18 is provided with a suitable source of direct current voltage B+ which is applied through a resistor R1 to its collector. Its emitter is connected to a point of reference potential, such as ground. Output signals from the inverter transistor 18 are derived at its collector and applied to a first input transistor Q1 in the NOR gate 19. The first transistor Q1 is connected to the source of direct current voltage B+ through a resistor R2 and its emitter is connected to ground. Signals from the squelch circuit 15 are also applied through a capacitor C1 (which may not be necessary) to the timing circuit 17. The timing circuit 17 may take any suitable form, such as a one shot or monostable multivibrator, which produces a timing signal in response to a transition or pulse signal, and thereafter is inactive until the next transition. We have assumed the timing signal is a steady positive value for a predetermined length of time. The output of the timing circuit 17 is applied through a resistor R3 to a second input transistor Q2 in the NOR gate 19. The transistor Q2 is also connected through the resistor R2 to the source of direct current potential B+ and to the reference potential. With respect to the data circuit 16, we have assumed that it produces a continuous positive signal when data signals are present. This positive signal is applied through a resistor R4 to a third input transistor Q3 in the NOR gate 19. The transistor Q3 is also connected through the resistor R2 to the source of direct current potential B+ and to the point of reference potential. The collectors of the three input transistors Q1, Q2, Q3 are connected to an output terminal or line 25 which is connected to the audio amplifier 13.

Operation of our circuit of FIG. 2 will be explained in connection with the wave forms shown in FIG. 3, and plotted along a common time axis. FIG. 3a shows the output from the squelch circuit 15; FIG. 3b shows the output from the inverter 18; FIG. 3c shows the output from the timing circuit 17; FIG. 3d shows the output from the data circuit 16; and FIG. 3e shows the output from the NOR gate 19. Prior to the time T1, we have assumed that no signal is received by the receiver. At this time, the output from the squelch circuit 15 produces a low or squelch output signal. As a consequence, the inverter output voltage is at a relatively high value, which causes the transistor Q1 to conduct. This lowers the voltage on the line 25 (the NOR gate output) so as to cause the audio amplifier 13 to block any signals. The low values of the timing circuit output and the data circuit output have no effect.

At the time T1, we have assumed that the radio receiver receives a carrier signal. This causes the squelch circuit 15 to produce a unsquelch signal which is positive going. The inverter 18 inverts the signal and produces a low value. The change from a squelch signal to an unsquelch signal at the output of the squelch circuit 15 also initiates the timing circuit 17 to start its timed period. At this time, no data has been received, so that the data circuit output is still at a low value. Because of the inherent circuit characteristics, the inverter output switches from a high to low value a little more quickly than the timing circuit switches from a low to high value. Hence, the inputs to the transistors Q1, Q2, Q3 are at a low value for a moment, so that the line 25 goes high for a brief time. Thus, as shown in FIG. 3e, there will be a very narrow positive pulse in the NOR gate output. However, this pulse is of very short duration, in the order of a few microseconds, until the timing circuit produces a high output signal. When this occurs, the NOR gate output becomes low again. Because of time delay and capacities present in the audio amplifier 13, it is very unlikely that any sounds will be passed by the audio amplifier 13 and heard from the loudspeaker 14.

At some time T2, before the end of the timed period of the timing circuit 17, we have assumed that data signals have been received, so that the data circuit 16 produces a high output. This high output causes the transistor Q3 to conduct, so that the line 25 is at a low value. Hence, even though the timing period of the timing circuit 17 terminates at the time T3, the line 25 is still at a low value so that the amplifier 13 passes no signals. If, however, data signals have not been received by the time T3, then all inputs to the NOR gate 19 are at a low value, the output line 25 is at a high value, and the amplifier 13 permits audio signals to pass to the loudspeaker 14.

At the time T4, we have assumed that the data signals end. The data circuit output goes to a low value, so that the transistor Q3 is turned off. Under these circumstances, the three transistors Q1, Q2, Q3 are all turned off, so that the line 25 can then have a high value, approaching the voltage of the source of direct current potential. This high value is used as a passing signal to cause the amplifier 13 to pass signals to the loudspeaker 14. Hence, the receiver remains muted or silent after a carrier is received and until the timing period ends and the data signals end. Thus, the sounds of the data signals are prevented from being reproduced in the loudspeaker 14.

Persons skilled in the art will understand that the timing period of the circuit 17 should be set so as to cover the time between initiation of a carrier transmission and the beginning of data signals. In one actual embodiment, the data signals are not transmitted for approximately 70 milliseconds following the start of the carrier. Hence, the timing period is made approximately 100 milliseconds to insure that the receiver does not pass signals during this time until the data signals begin and continue muting the receiver. Of course, if no data signals are received, then voice or whatever information is transmitted will be heard immediately after the timing period has expired. Thus our muting circuit functions either with or without data signals.

While we have shown only one embodiment of our invention, persons skilled in the art will appreciate the many alternatives that can be made to the diagrams shown in FIGS. 1 and 2. For example, our invention can be used with other types of receivers, such as amplitude modulation receivers. In such a receiver, an automatic gain control or other suitable type of signal indicating presence of a carrier can be used in the same way as the unsquelch signal. We prefer that the timing signal be started and produced only in response to the transition from a squelch to an unsquelch signal. However, this is not essential since the start of a timing signal in response to the transition from an unsquelch to a squelch signal would have no undesired effect. And as already mentioned, the inverter circuit 18 may not be required if signals from the squelch circuit 15 are of the correct polarity to use with the NOR gate 19. The circuit which produces signals in response to data can take any suitable form. For example, it may include a bandpass filter for the data pulse frequency and a rectifier and a filter that produce continuous direct current signals (in response to the data pulses) to provide the function needed at the third input of the NOR gate 19. And finally, the functions of the NOR gate 19 may be provided by various types of logic circuits, in place of the three transistors connected to a common line 25 as shown in FIG. 2. Therefore, it is to be understood that modifications may be made without departing from the spirit of the invention or from the scope of the claims.

What we claim as new and desire to secure by Letters Patent of the United States is:

1. In a radio receiver for receiving radio frequency signals modulated by audio signals or data pulses, said receiver having means for detecting said radio frequency signals, means connected to said detecting means for producing a squelch signal in the absence of radio frequency signals and an unsquelch signal in the presence of radio frequency signals, and means connected to said detecting means for producing output signals in response to said detected audio modulated radio frequency signals, an improved arrangement comprising:
   a. a timing circuit for connection to said squelch signal producing means to produce a timing signal of predetermined time duration in response to an unsquelch signal;
   b. means for connection to said radio frequency detecting means for producing a data signal in response to presence of said data pulses in said detected radio frequency signals;
   c. and means for connecting said timing circuit and said data signal producing means to said output signal producing means for blocking output signal production in response to either said timing signal or said data signal.

2. The improved arrangement of claim 1 and further comprising means connecting said squelch signal producing means to said connecting means to enable said output signal production in response to the absence of said timing signal and said data signal, and the presence of said unsquelch signal, simultaneously.

3. A muting circuit for a radio receiver having a demodulator, a data circuit connected to said demodulator for producing a data signal in response to data pulses, an output circuit connected to said demodulator, and a squelch circuit connected to said demodulator for producing squelch and unsquelch signals in response to the absence and presence of a radio carrier respectively, said muting circuit comprising:
   a. a timing circuit adapted to be connected to said receiver squelch circuit for producing a timing signal having a predetermined time duration in response to said unsquelch signal;
   b. a gate circuit having three inputs and an output;
   c. means connecting one of said gate circuit inputs to said timing circuit;
   d. means adapted to connect a second of said gate circuit inputs to said receiver squelch circuit;
   e. means adapted to connect a third of said gate circuit inputs to said receiver data circuit;
   f. and means adapted to connect said gate circuit output to said receiver output circuit for muting said output circuit in response to at least one of: a timing signal, a data signal, and said squelch signal; and for unmuting said output circuit in response to the presence of said unsquelch signal and the absence of said timing signal and said data signal.

4. The muting circuit of claim 3 wherein said timing circuit produces said timing signal only in response to an unsquelch signal following a squelch signal.

5. The muting circuit of claim 3 wherein said timing circuit produces one timing signal in response to the transition from a squelch signal to an unsquelch signal, and thereafter remains inactive until the next said transition.

6. The muting circuit of claim 5 wherein said data signal is continuous in response to said data pulses.

* * * * *